(12) United States Patent
Kim et al.

(10) Patent No.: US 7,977,419 B2
(45) Date of Patent: Jul. 12, 2011

(54) DIELECTRIC BODY AND METHOD FOR PRODUCTION THEREOF

(75) Inventors: Tae-Kyoung Kim, Suwon-si (KR); Ho-Gyu Yoon, Seoul (KR); Jin-Cheol Kim, Hwaseong-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 160 days.

(21) Appl. No.: 12/570,754

(22) Filed: Sep. 30, 2009

(65) Prior Publication Data

US 2010/0271749 A1 Oct. 28, 2010

(30) Foreign Application Priority Data

Apr. 22, 2009 (KR) .................. 10-2009-0035194

(51) Int. Cl.
*C08K 3/10* (2006.01)

(52) U.S. Cl. ........................................ 524/413; 524/433

(58) Field of Classification Search .................. 524/413, 524/433
See application file for complete search history.

(56) References Cited

U.S. PATENT DOCUMENTS 7,015,532 B2 * 3/2006 Sandhu et al. ................ 257/310
* cited by examiner

*Primary Examiner* — Peter Szekely
(74) *Attorney, Agent, or Firm* — McDermott Will & Emery LLP

(57) ABSTRACT

A dielectric body and a method of producing the dielectric body are disclosed. In accordance with an embodiment of the present invention, the dielectric body using a polymer matrix and being expressed in the following Reaction Scheme 1 includes two or more kinds of ceramic fillers having different x values in the following Reaction Scheme 1. In this way, a dielectric body having a stable dielectric constant as well as a high dielectric constant against the change in temperature can be manufactured.

$$Ba_{1-x}Sr_xTiO_3 \quad \text{[Reaction Scheme 1]}$$

whereas $0 < x \leq 1$.

17 Claims, 12 Drawing Sheets

DIELECTRIC BODY AND METHOD FOR PRODUCTION THEREOF

CROSS-REFERENCE TO RELATED APPLICATIONS

This application claims the benefit of Korean Patent Application No. 10-2009-0035194, filed with the Korean Intellectual Property Office on Apr. 22, 2009, the disclosure of which is incorporated herein by reference in its entirety.

BACKGROUND

1. Technical Field

The present invention relates to a dielectric body and a method for producing the dielectric body.

2. Description of the Related Art

With the trends toward smaller sizes and increasing convergence of current electronic devices, the importance of embedding technologies for passive parts, such as resistors, inductors and capacitors, is increasingly becoming significant. Particularly, the importance of the embedding technology for capacitors is increasingly becoming significant since a greater number of capacitors are required to be mounted on a single board, compared to other passive parts.

In the case of capacitors for decoupling or capacitors for signal matching, higher capacity and lower inductance are required, but the development thereof has been insufficient.

In the case of organic-inorganic composite materials that are currently under the development in connection with the above problem, low dielectric constant is another problem. In the case of ceramic thin films, high manufacturing costs and low reliability are problems to be solved, making it difficult to be employed in a real product.

In the conventional insulating layer of organic-inorganic composite material for embedding capacitors, if ceramic powder having high dielectric constant is added to the insulating layer as a filler, there may be a restriction in obtaining uniform dispersion and high filling ratio, making it difficult to increase the dielectric constant of a dielectric body (composite material).

In addition, there may be difficulty in obtaining a stable dielectric constant in accordance with the temperature of the dielectric body due to the thermal expansion properties of typical polymer materials. Although there is a technology that has been developed to solve the problem through the application of ceramic fillers that may solve the temperature coefficient of capacitance (TCC) of polymer materials, there may still be difficulty in finding the most appropriate ceramic filler in accordance with the TCC properties of polymer materials.

Furthermore, in the conventional method of dispersing the ceramic filler into a polymer matrix, it may be difficult to manufacture a highly uniform dielectric body because of sedimentation of ceramic powder having a higher gravity than a polymer solution, and there may also be a number of limitations in increasing the amount to be added.

SUMMARY

Accordingly, the present invention provides a dielectric body that has a stable dielectric constant as well as a high dielectric constant against the change in temperature. Furthermore, the present invention provides a method of manufacturing the dielectric body in a more efficient way by improving the method of dispersing a ceramic filler into a polymer material.

An aspect of the present invention provides a dielectric body that uses a polymer matrix and is expressed in the following Reaction Scheme 1. In accordance with an embodiment of the present invention, the dielectric body includes two or more kinds of ceramic fillers having different x values in the following Reaction Scheme 1.

$Ba_{1-x}Sr_xTiO_3$ [Reaction Scheme 1]

whereas $0 < x \leq 1$.

A total amount of the two or more kinds of ceramic fillers having different x values can be 10 to 60 vol. % of the volume of the dielectric body.

A type of the two of more kinds of ceramic fillers having different x values being used in the dielectric body and an amount of each of the two or more kinds of ceramic fillers being used can be controlled such that a certain TCC (constant temperature coefficient of capacitance, ppm/° C.) value or a certain capacitance variation value is maintained in spite of a change in temperature.

The dielectric body can have a TTC value of −300 to 300 ppm/° C. in a temperature range of −55 to 125° C.

The two or more kinds of ceramic fillers having different x values can include $Ba_{0.9}Sr_{0.1}TiO_3$, $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$.

A total amount of the two or more kinds of ceramic fillers having different x values can be 20 to 40 vol. % of the volume of the dielectric body.

Among the two or more kinds of ceramic fillers having different x values, the $Ba_{0.9}Sr_{0.1}TiO_3$ can be 20~30 vol. %, the $Ba_{0.8}Sr_{0.2}TiO_3$ can be 0.1~1 vol. %, the $Ba_{0.7}Sr_{0.3}TiO_3$ can be 0.1~1 vol. %, the $Ba_{0.6}Sr_{0.4}TiO_3$ can be 0.1~2 vol. %, and the $Ba_{0.5}Sr_{0.5}TiO_3$ can be 0.1~1 vol. %.

Another aspect of the present invention provides a method of manufacturing a dielectric body. In accordance with an embodiment of the present invention, the method includes manufacturing a polymer solution by mixing a first solvent and a polymer matrix together, in which the polymer matrix is soluble in the first solvent, manufacturing a ceramic filler sol by mixing the first solvent, a dispersing agent and ceramic fillers together, manufacturing a dispersion by mixing the polymer solution and the ceramic filler sol together, precipitating the polymer matrix having the ceramic fillers dispersed therein by dropping droplets of the dispersion in a second solvent one at a time, in which the second solvent is insoluble in the first solvent, and evaporating the solvent by drying the precipitated polymer matrix. Here, the order of the manufacturing of the polymer solution and the manufacturing of the ceramic filler sol is interchangeable.

The ceramic fillers can be expressed in the following Reaction Scheme 1 and include two or more kinds of ceramic fillers having different x values in the following Reaction Scheme 1, $Ba_{1-x}Sr_xTiO_3$ [Reaction Scheme 1]

whereas $0 < x \leq 1$.

A total amount of the two or more kinds of ceramic fillers having different x values can be 10 to 60 vol. % of the volume of the dielectric body.

A type of the two or more kinds of ceramic fillers having different x values being used in the dielectric body and an amount of each of the two or more kinds of ceramic fillers being used can be controlled such that a certain TCC (constant temperature coefficient of capacitance, ppm/° C.) value is maintained in spite of a change in temperature.

The two or more kinds of ceramic fillers having different x values can include $Ba_{0.9}Sr_{0.1}TiO_3$, $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$.

A total amount of the two or more kinds of ceramic fillers having different x values can be 20 to 40 vol. % of the volume of the dielectric body.

Among the two or more kinds of ceramic fillers having different x values, the $Ba_{0.9}Sr_{0.1}TiO_3$ can be 20~30 vol. %, the $Ba_{0.8}Sr_{0.2}TiO_3$ can be 0.1~1 vol. %, the $Ba_{0.7}Sr_{0.3}TiO_3$ can be 0.1~1 vol. %, the $Ba_{0.6}Sr_{0.4}TiO_3$ can be 0.1~2 vol. %, and the $Ba_{0.5}Sr_{0.5}TiO_3$ can be 0.1~1 vol. %. The first solvent can be toluene and the second solvent is methanol.

Another aspect of the present invention provides an insulating material for a capacitor-embedded substrate using the dielectric body described above.

Another aspect of the present invention provides a capacitor-embedded substrate using the insulating material described above.

Additional aspects and advantages of the present invention will be set forth in part in the description which follows, and in part will be obvious from the description, or may be learned by practice of the invention.

DETAILED DESCRIPTION

Figure 1:
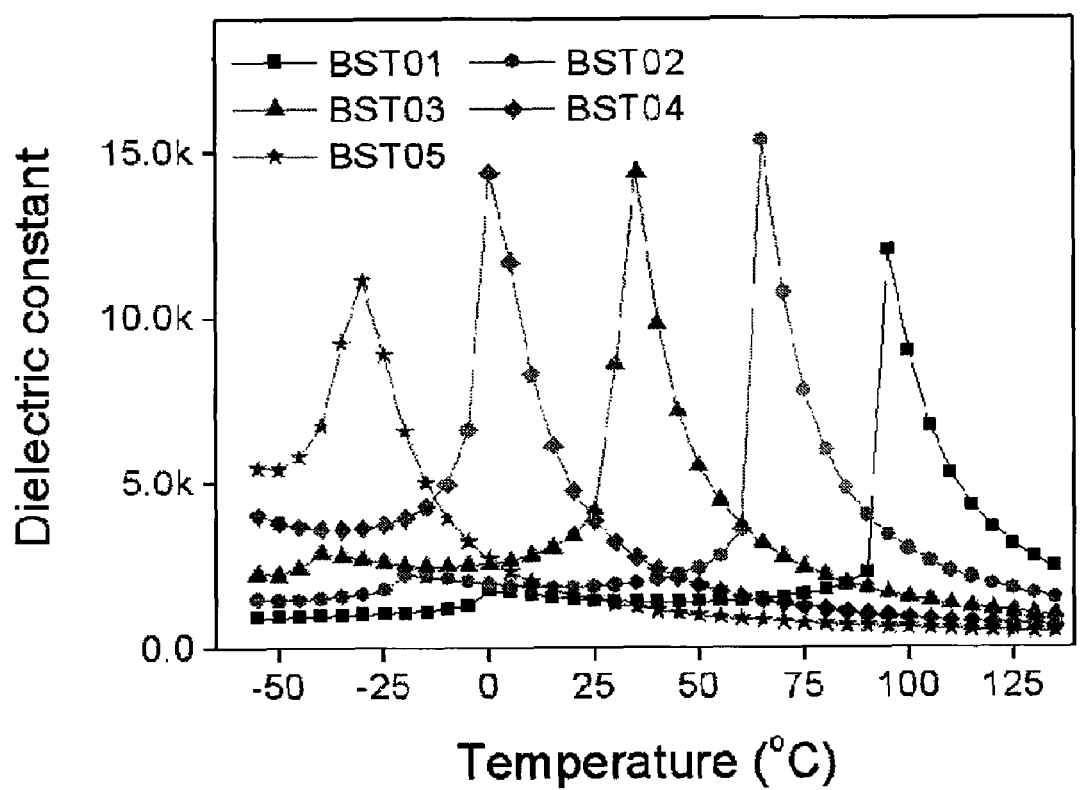
FIG. 1 is a graph illustrating changes in dielectric constant according to temperature for different kinds of ceramic fillers.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A dielectric body and a method of producing the dielectric body according to certain embodiments of the present invention will be described below in more detail with reference to the accompanying drawings. Those components that are the same or are in correspondence are rendered the same reference numeral regardless of the figure number, and redundant descriptions are omitted.

In accordance with an embodiment of the present invention, a dielectric body using a polymer matrix is displayed in the following Reaction Scheme 1 and includes two or more kinds of ceramic fillers having different x values represented by the following Reaction Scheme 1.

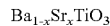   [Reaction Scheme 1]

where, x is within a range of $0<x\leqq1$.

A polymer matrix being used in an embodiment of the present invention is not restricted to a particular type if it can be used as a dielectric body. For example, an epoxy system matrix or a poly phenylene sulfide (PPS) system matrix can be used. In certain cases, poly phenylene oxide (PPO) or liquid crystal polymer, which has less dielectric loss in a high frequency, small dimensional changes according to temperature changes, and good moisture resistance and chemical resistance, can be used.

The x value represented by the Reaction Scheme 1 can be selected in order to obtain the stability of high dielectric constant according to temperature changes, depending on the properties of polymer matrixes. Here, Curie temperature can be controlled, depending on the x values. As the composition of Sr increases, the Curie temperature may decrease. That is, depending on the amount of Sr, dielectric constant changes according to temperature can be reduced.

For example, 0.1, 0.2, 0.3, 0.4 or 0.5 can be selected for the x value. Accordingly, for the ceramic fillers, $Ba_{0.9}Sr_{0.1}TiO_3$ will be referred to as BST01, and $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$ as BST02, BST03, BST04 and BST05, respectively.

FIG. 1 is a graph illustrating changes in dielectric constant for a disk that is manufactured using ceramic fillers having different x values. The disk is manufactured by being sintered at the temperature of 1230 degrees Celsius for 2 hours (d=10 mm, t=1 mm).

As in the example shown in FIG. 1, the dielectric constant of a particular temperature vary, depending on the x value.

A complete solid solution with an x value exceeding 1 does not exist.

In accordance with an embodiment of the present invention, the total amount of two or more kinds of ceramic fillers having different x values is 10 to 60 vol. % of the volume of a dielectric body.

If the amount of ceramic fillers is less than 10 vol. %, it may not affect the enhancement of dielectric constant. If the amount of the ceramic fillers is greater than 60 vol. %, it may be difficult to increase the dielectric constant due to pores on the surfaces of the ceramic fillers. Therefore, it is preferable that the amount of ceramic fillers is within 20 to 40 vol. % of the volume of the dielectric body.

Figure 2:
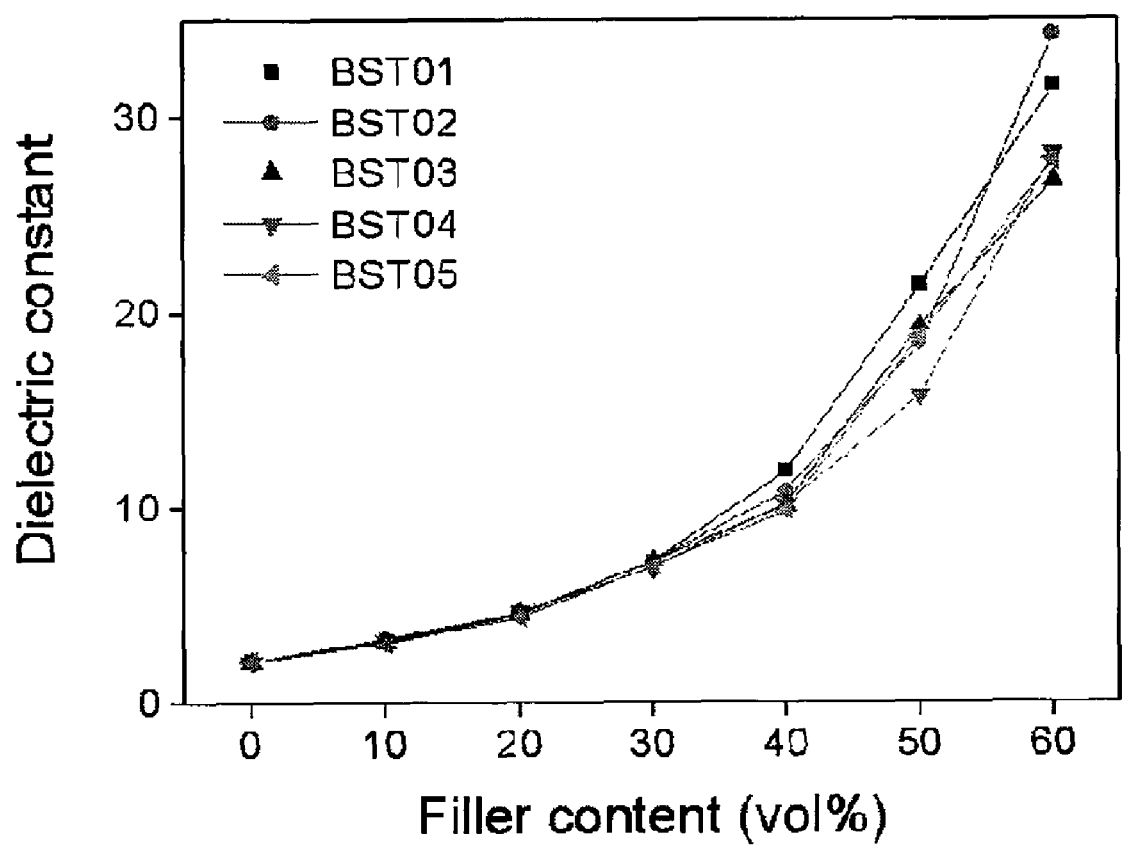
FIG. 2 is a graph illustrating changes in dielectric constant according to filler content for different kinds of ceramic fillers.
Figure 3:
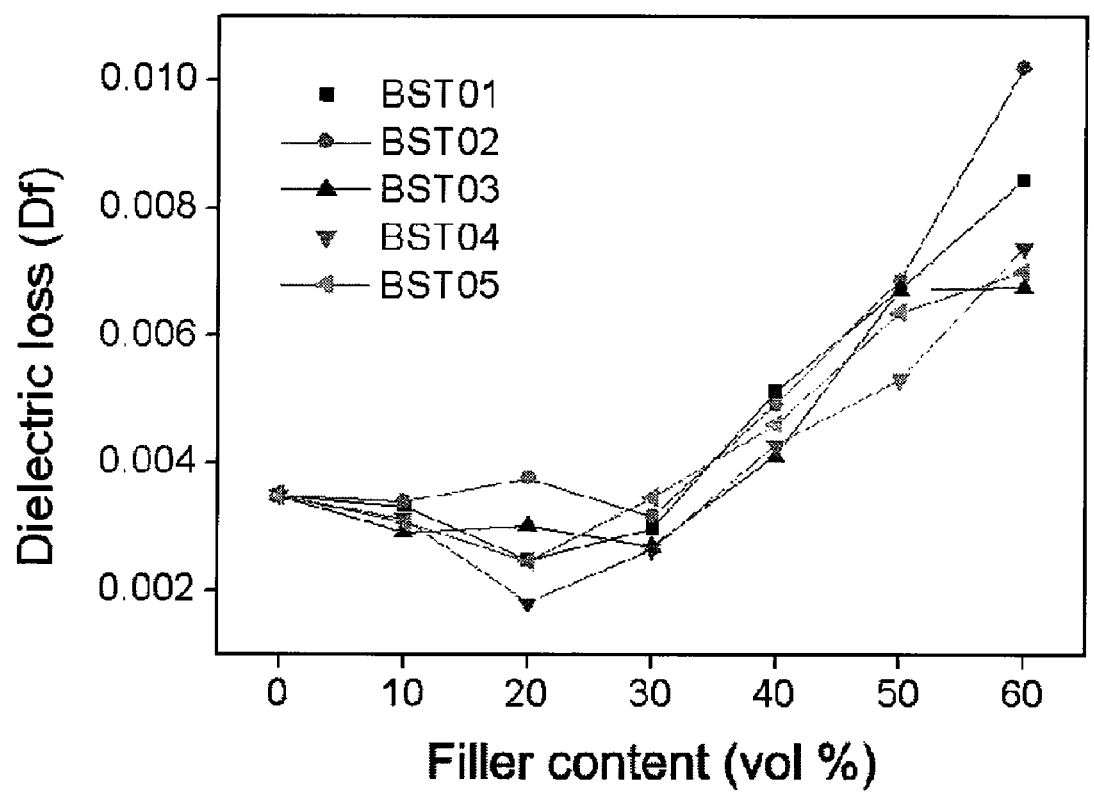
FIG. 3 is a graph illustrating changes in dielectric loss according to filler content for different kinds of ceramic fillers.

FIG. 2 is a graph illustrating dielectric constant measured after forming an electrode by printing silver paste on both surfaces of a composite manufactured in the shape of a disk. FIG. 3 is a graph illustrating dielectric loss in connection with FIG. 2.

As the added amount of ceramic fillers increases, the dielectric constant and dielectric loss also increase. Furthermore, if the added amount of ceramic fillers is 30 vol. % or less, it can be noticed that the dielectric loss is 0.004 or less.

In certain examples, the two or more kinds of ceramic fillers having different x values can include $Ba_{0.9}Sr_{0.1}TiO_3$, $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$.

The type of the two of more kinds of ceramic fillers having different x values being used in the dielectric body and the amount of each of the two or more kinds of ceramic fillers being used can be controlled in such a way that a certain TCC (ppm/° C.) value can be maintained in accordance with temperature changes.

In certain examples, the dielectric body can have a TTC value of −300 to 300 ppm/° C. within a temperature range of −55 to 125° C., which is one possible condition for being used in a capacitor, and in certain cases, a TTC value of −30 to 30 ppm/° C.

A certain example of the controlled type and amount of the two or more kinds of ceramic fillers may include 20~30 vol. % of the $Ba_{0.9}Sr_{0.1}TiO_3$, 0.1~1 vol. % of the $Ba_{0.8}Sr_{0.2}TiO_3$, 0.1~1 vol. % of the $Ba_{0.7}Sr_{0.3}TiO_3$, 0.1~2 vol. % of the $Ba_{0.6}Sr_{0.4}TiO_3$, and 0.1~1 vol. % of the $Ba_{0.5}Sr_{0.5}TiO_3$.

As such, if the two or more kinds of ceramic fillers are included like the example above, a stable capacitance variation value and a stable TCC (temperature coefficient of capacitance) value can be obtained at various temperatures. That is, by using BST ceramic fillers with different combinations thereof having a high dielectric constant, a composite material having a stable dielectric constant as well as a high dielectric constant can be manufactured in accordance with temperature changes.

Another embodiment of the present invention provides a method of manufacturing a dielectric body. The method includes manufacturing a polymer solution by mixing a first solvent and a polymer matrix together, in which the polymer matrix is soluble in the first solvent, manufacturing a ceramic filler sol by mixing the first solvent, a dispersing agent and ceramic fillers together (not necessarily in the order of manufacturing of the polymer solution and manufacturing of the ceramic filler sol), manufacturing a dispersion by mixing the polymer solution and the ceramic filler sol together, precipitating the polymer matrix having the ceramic fillers dispersed therein by dropping a droplet of the dispersion one at a time in a second solvent being insoluble in the first solvent, and evaporating the solvent by drying the precipitated polymer matrix.

The first solvent that has a small difference in solubility constant from the polymer matrix can be toluene, and can be selected, depending on whether or not the polymer matrix being used is soluble. However, if the first solvent is soluble and able to be distilled in a following process, then the type thereof is not limited to the present embodiment.

Here, the second solvent, which is a solvent being insoluble in the first solvent, can be methanol.

In the case where a dielectric body is manufactured through the conventional dispersing method, it could be observed that non-uniformities were caused due to sedimentation of ceramic fillers on standby in the process or in the process of drying, since the density of the dispersed ceramic fillers is greater than those of the polymer matrix and the solvents.

According to the method in accordance with an embodiment of the present invention, droplets of the dispersion using the first solvent are dropped one at a time into the second solvent being insoluble in the first solvent, allowing the ceramic fillers to be uniformly dispersed in the polymer matrix and to be precipitated. That is, a composite material having high dispersion of ceramic fillers can be manufactured.

After precipitating the polymer matrix having the ceramic fillers uniformly dispersed therein, the solvent is evaporated, and then a mortar is used to pulverize the polymer matrix to produce highly dispersed polymer-ceramic composite granules. The produced granules can be molded by way of high-temperature press molding or injection molding.

The type of ceramic fillers that can be used in the present method and the vol. % thereof are already described above.

In accordance with another embodiment of the present invention, an insulating material for a capacitor-embedded substrate using the dielectric body and the substrate are provided.

Below, the present invention will be described in detail with reference to certain examples.

Example

Poly (2,6-dimethyl phenylene oxide, Sigma-Aldrich Corporation) is used for polyphenylene oxide (PPO). In order to measure the dielectric constant of the material, a disk having a diameter of 40 mm and a thickness of about 1 mm is manufactured by way of high-temperature press molding at the temperature of 310 degrees Celsius and pressure of 6 kgf/cm², and then the dielectric constant is measured for different temperatures.

The manufacturing process is as follows.

First, a polymer solution was prepared by completely melting the PPO in toluene using a magnetic stirrer while the toluene was heated at a low temperature.

Then, a ceramic filler sol was manufactured by dispersing BST ceramic fillers in the toluene. When dispersing, an ultrasonic homogenizer was used. Here, triton x-100 (Sigma-Aldrich Corporation, USA) was used as a dispersing agent. The amounts of different kinds of ceramic fillers to be dispersed were calculated and adjusted according to the calculation, based on later experiments. Table 1 below shows the classification types and amounts of the ceramic fillers needed in the later experiments.

TABLE 1

| Type of filler | Quantity of filler (compared to the volume of dielectric body) | | | | | |
|---|---|---|---|---|---|---|
| $Ba_{0.9}Sr_{0.1}TiO_3$ (BST01) | 10 vol. % | 20 vol. % | 30 vol. % | 40 vol. % | 50 vol. % | 60 vol. % |
| $Ba_{0.8}Sr_{0.2}TiO_3$ (BST02) | 10 vol. % | 20 vol. % | 30 vol. % | 40 vol. % | 50 vol. % | 60 vol. % |
| $Ba_{0.7}Sr_{0.3}TiO_3$ (BST03) | 10 vol. % | 20 vol. % | 30 vol. % | 40 vol. % | 50 vol. % | 60 vol. % |
| $Ba_{0.6}Sr_{0.4}TiO_3$ (BST04) | 10 vol. % | 20 vol. % | 30 vol. % | 40 vol. % | 50 vol. % | 60 vol. % |
| $Ba_{0.5}Sr_{0.5}TiO_3$ (BST05) | 10 vol. % | 20 vol. % | 30 vol. % | 40 vol. % | 50 vol. % | 60 vol. % |

Subsequently, the polymer solution and the ceramic filler sol, which had been prepared individually, were mixed using the magnetic stirrer, and then completely dispersed using the ultrasonic homogenizer. While continuously stirring the dispersing solution manufactured through the above processes, droplets of the dispersing solution were dropped into methyl alcohol, which has a large difference in solubility constant from toluene, one at a time by using a dispenser.

A polymer matrix having the BST ceramic fillers dispersed therein was precipitated in the shape of a sponge from the methyl alcohol. Subsequently, the precipitate was dried at 80 degrees Celsius in order to completely evaporate the solvent, and then pulverized until it became a soft mass.

After forming the soft mass through the drying and pulverizing processes, it was put into a mold and pressed at the temperature of 310 degrees Celsius and pressure of 6 kgf/cm² for 20 minutes, thus producing a sample in the shape of a disk.

Experiment 1

Among the types of the BST ceramic fillers in the previously described example, BST01 was selected, and then a dielectric body was manufactured. An experiment was conducted to find out how many ceramic fillers were lost for different vol. % of the ceramic fillers. Here, the TGA analysis was used for the analyzing.

As shown in the following Table 2, a dielectric body having a predetermined amount of ceramic fillers could be manufactured without any loss of filler content caused by sedimentation of the ceramic fillers due to a density difference.

TABLE 2

|  | Real BST input (wt %) | TGA residual (wt %) |
| --- | --- | --- |
| 0 vol. % | 0 | 0.05 |
| 10 vol. % | 34.24 | 33.61 |
| 20 vol. % | 53.79 | 53.64 |
| 30 vol. % | 66.43 | 66.32 |
| 40 vol. % | 75.28 | 75.03 |
| 50 vol. % | 81.82 | 81.81 |
| 60 vol. % | 86.84 | 86.18 |

Figure 4:
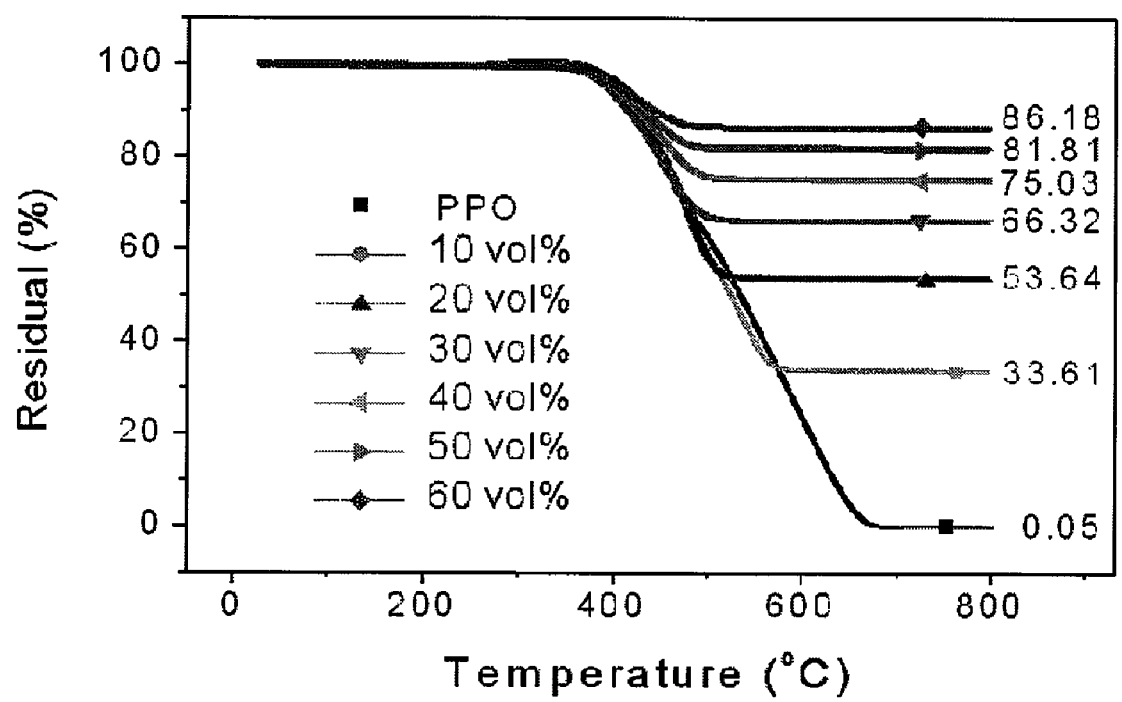
FIG. 4 is a graph illustrating the loss of ceramic fillers of a dielectric body that is manufactured according to filler content for different kinds of ceramic fillers.

The experimental results of Table 1 are illustrated in the graph shown in FIG. 4.

Through the experimental results of Table 1, it is demonstrated that the method of manufacturing a dielectric body in accordance with an embodiment of the present invention is very efficient in manufacturing a dielectric body having a high filler content.

Experiment 2

An experiment was conducted to observe changes in dielectric constant in accordance with the type, amount to be added and temperature of each ceramic filler.

A capacitance variation value was based on the value at the temperature of 25 degrees Celsius, and the TCC value was calculated by the following Mathematical Equation 1.

$$TCC = \frac{1}{C_{at\ 25^\circ\ C.}} \frac{C_{measured\ temp} - C_{at\ 25^\circ\ C.}}{measured\ Temp. - 25} \times 10^6 (ppm/^\circ\ C.)$$ [Mathematical Equation 1]

Figure 5:
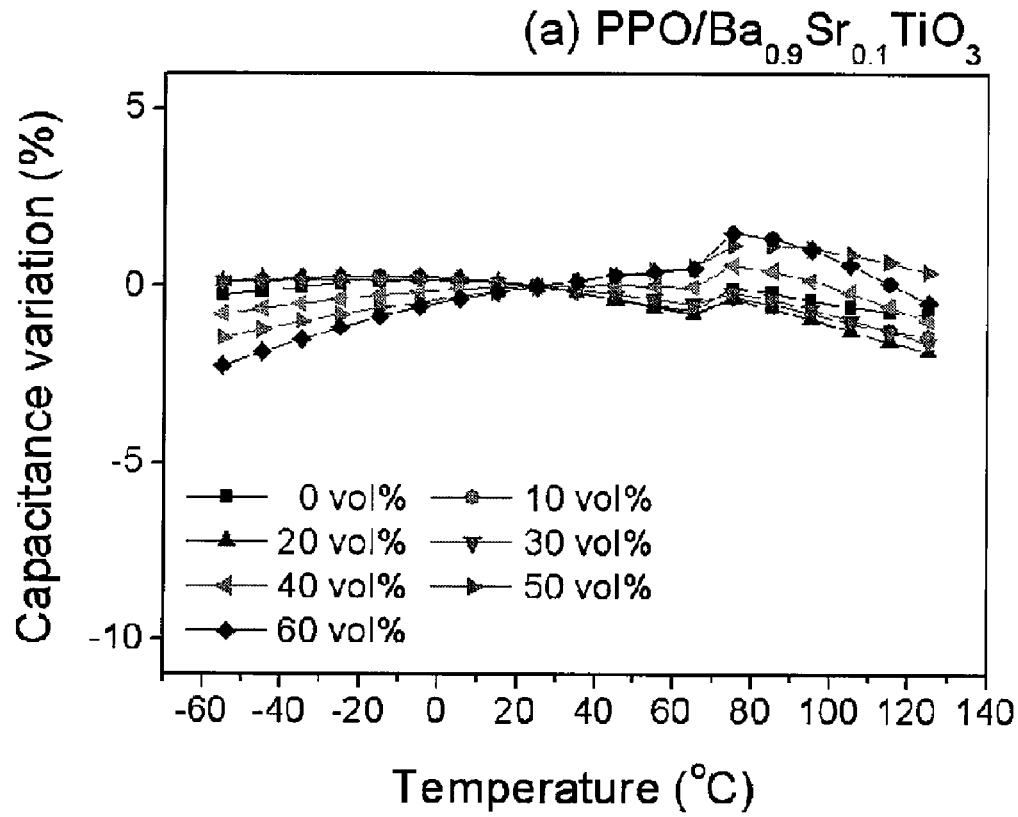
FIG. 5 represents experimental data of BST01.
Figure 5:
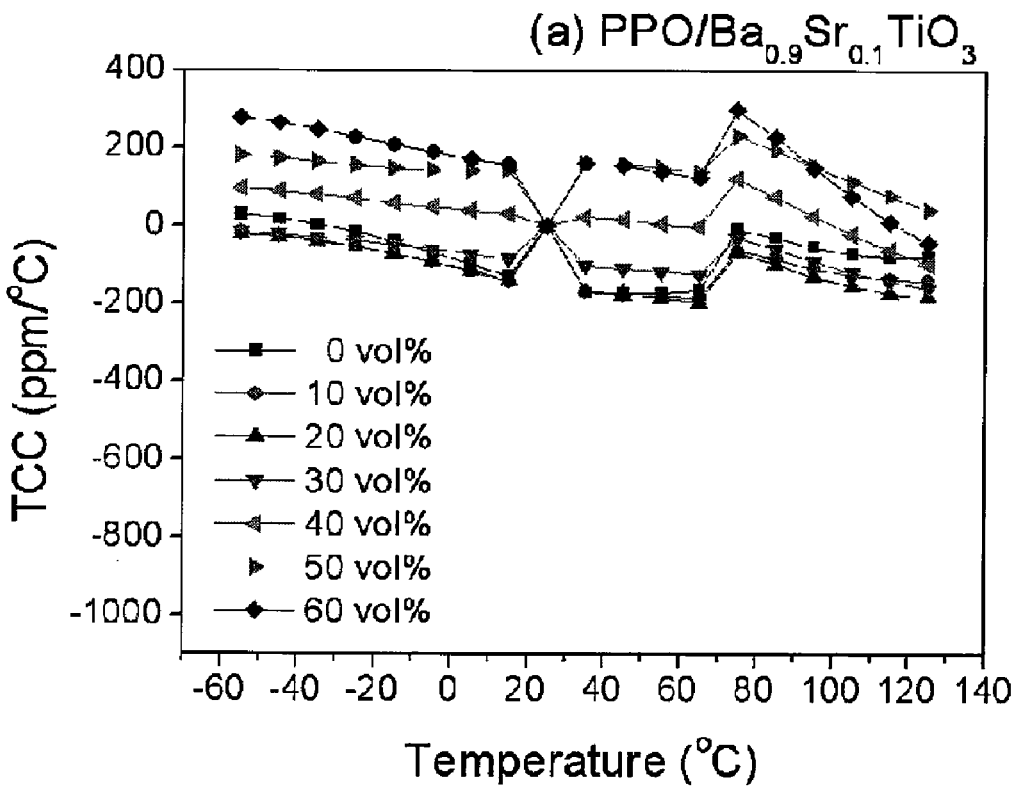
Figure 6:
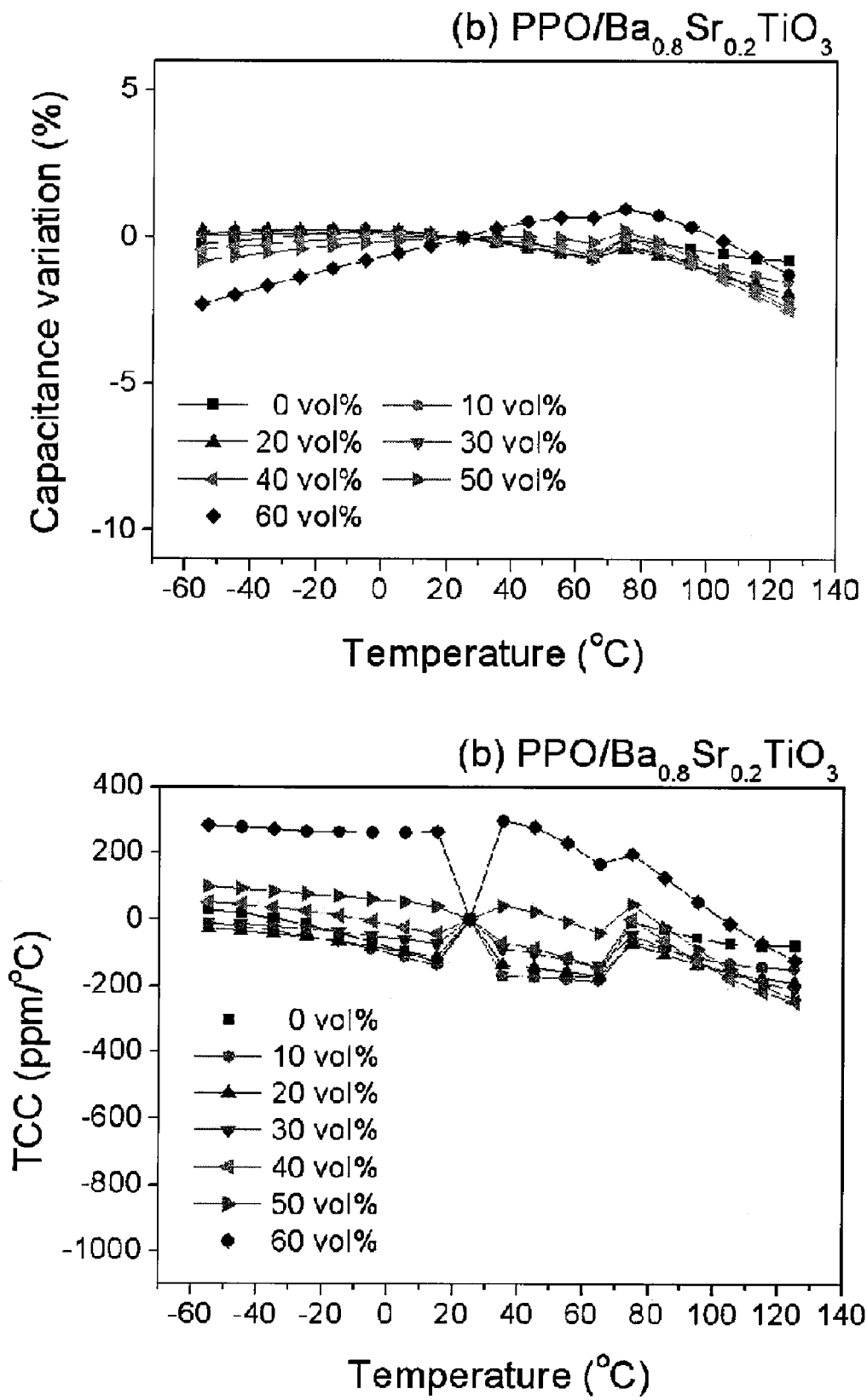
FIG. 6 represents experimental data of BST02.
Figure 7:
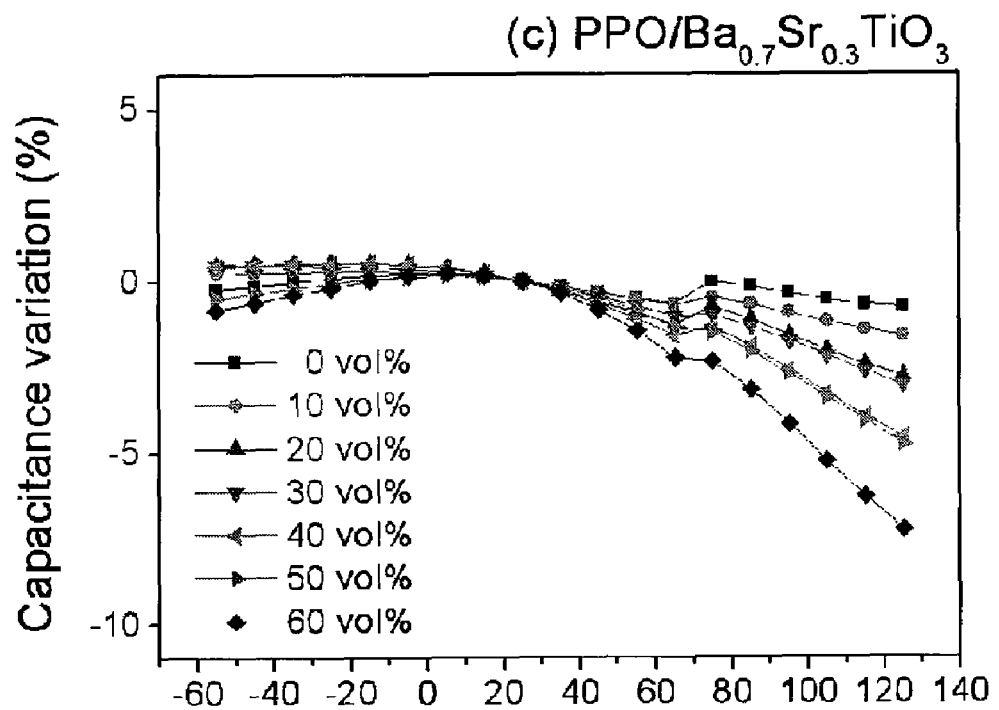
FIG. 7 represents experimental data of BST03.
Figure 7:
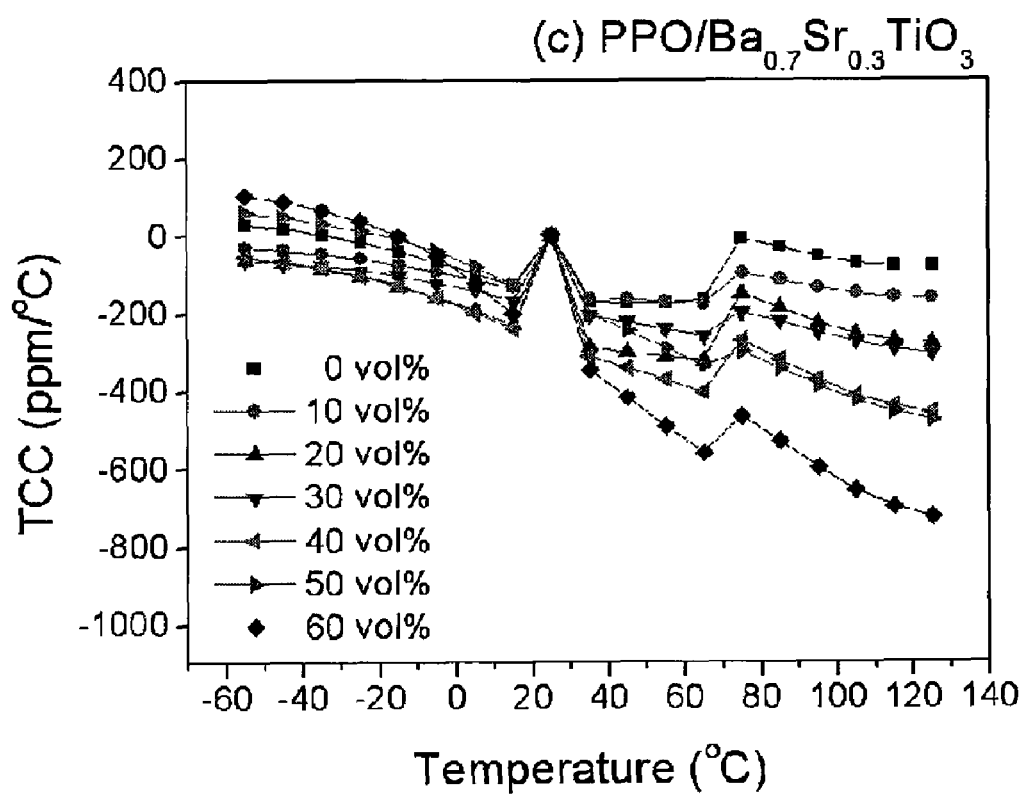
Figure 8:
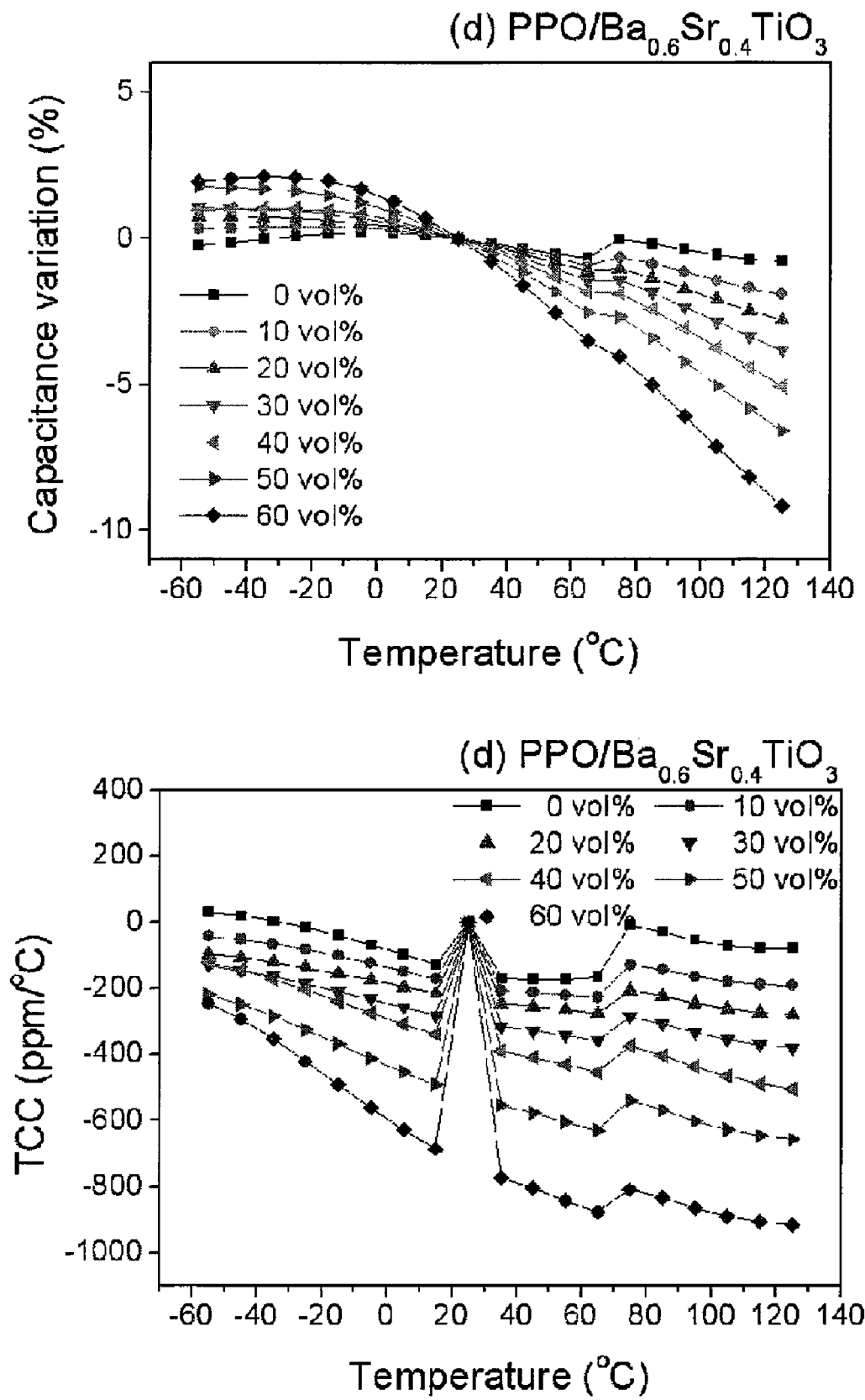
FIG. 8 represents experimental data of BST04.
Figure 9:
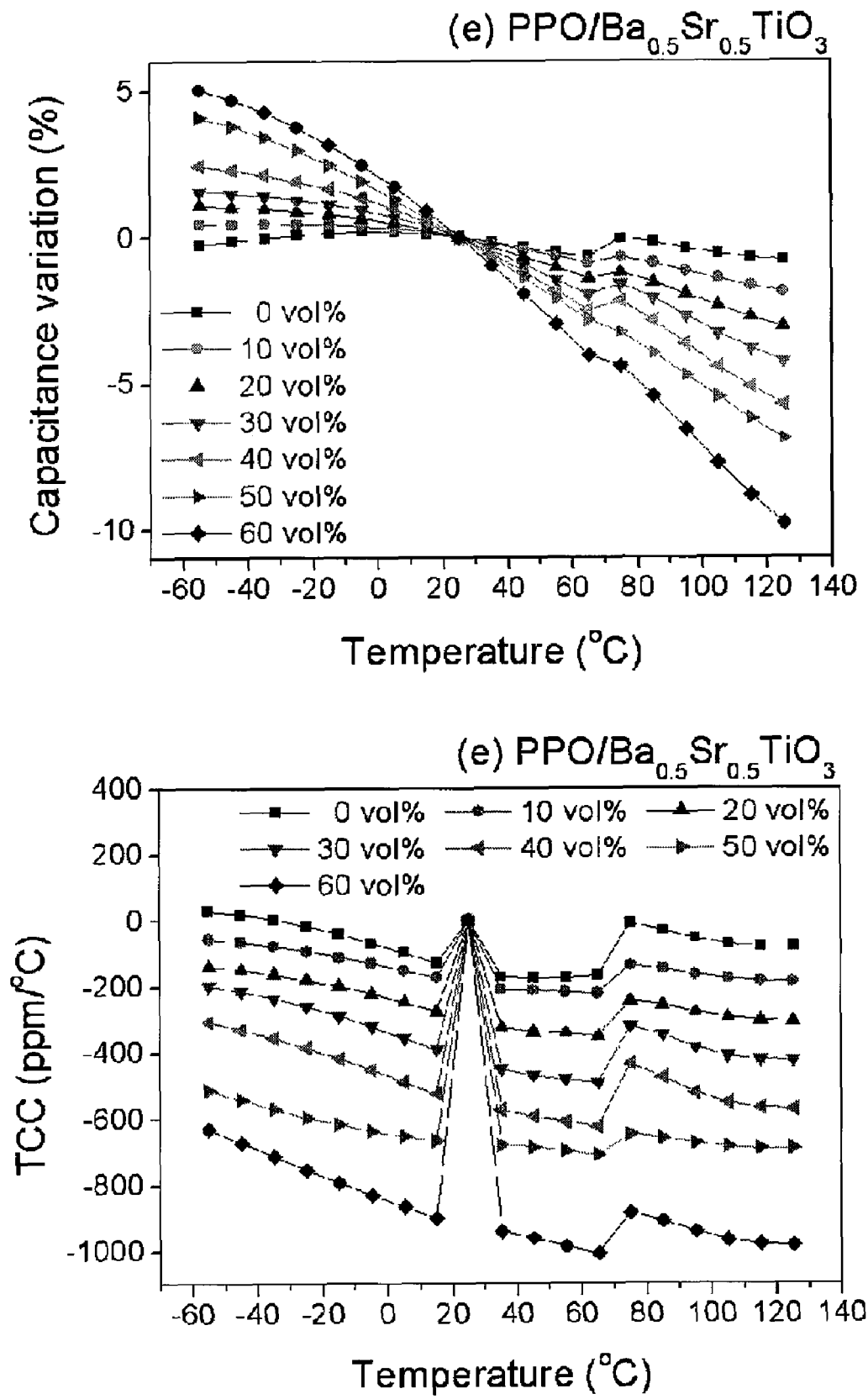
FIG. 9 represents experimental data of BST05.

The experimental results of BST01 can be found in FIG. 5, the experimental results of BST02 in FIG. 6, the experimental results of BST03 in FIG. 7, the experimental results of BST04 in FIG. 8, and the experimental results of BST05 in FIG. 9.

In most BST ceramic fillers, when the amount of ceramic fillers was 30 vol. %, a smallest change in TCC was required in accordance with temperature.

Table 3 below shows the experimental results of graphs of FIGS. 5 to 9.

TABLE 3

| Filler | Addition content (vol. %) | Capacitance variation (%) | TCC (ppm/° C.) |
| --- | --- | --- | --- |
| PPO |  | −0.77~0.21 | −173~−14 |
| $Ba_{0.9}Sr_{0.1}TiO_3$ | 10 | −1.40~0.28 | −186~−14 |
|  | 20 | −1.83~0.29 | −194~−20 |
|  | 30 | −1.58~0.19 | −158~−16 |
|  | 40 | −0.97~0.61 | −97~122 |
|  | 50 | −1.46~1.17 | 42~243 |
|  | 60 | −2.23~1.50 | −45~300 |
| $Ba_{0.8}Sr_{0.2}TiO_3$ | 10 | −1.48~0.27 | −185~−13 |
|  | 20 | −1.89~0.26 | −189~−27 |
|  | 30 | −2.11~0.15 | −211~−8 |
|  | 40 | −2.43~0.05 | −246~53 |
|  | 50 | −2.39~0.23 | −239~100 |
|  | 60 | −2.27~0.99 | −123~297 |
| $Ba_{0.7}Sr_{0.3}TiO_3$ | 10 | −1.62~0.30 | −176~−30 |
|  | 20 | −2.77~0.51 | −321~−59 |
|  | 30 | −3.06~0.50 | −306~−63 |
|  | 40 | −4.56~0.50 | −456~−54 |
|  | 50 | −4.77~0.16 | −477~61 |
|  | 60 | −7.25~0.24 | −725~106 |
| $Ba_{0.6}Sr_{0.4}TiO_3$ | 10 | −1.91~0.41 | −226~−42 |
|  | 20 | −2.80~0.77 | −280~−96 |
|  | 30 | −3.82~1.05 | −381~−131 |
|  | 40 | −5.05~1.03 | −506~−121 |
|  | 50 | −6.57~1.77 | −657~−221 |
|  | 60 | −9.15~2.12 | −915~−245 |
| $Ba_{0.5}Sr_{0.5}TiO_3$ | 10 | −1.86~0.46 | −220~−56 |
|  | 20 | −3.05~1.10 | −351~−138 |
|  | 30 | −4.25~1.58 | −491~−197 |
|  | 40 | −5.73~2.45 | −624~−306 |
|  | 50 | −6.90~4.10 | −709~−512 |
|  | 60 | −9.81~5.05 | −1007~−631 |

Experiment 3

An experiment was conducted in the same way as the above Experiment 2 for a dielectric body that had equal filler amount, i.e., 30 vol. %, for each of the five kinds of BST ceramic fillers, and another dielectric body that had a total filler amount of 30 vol. % for the five kinds of BST ceramic fillers, each of which had 6 vol. % in filler amount.

Here, BST012345 represents a dielectric body containing the five kinds of BST ceramic fillers, each of which has 6 vol. % in filler content.

Figure 10:
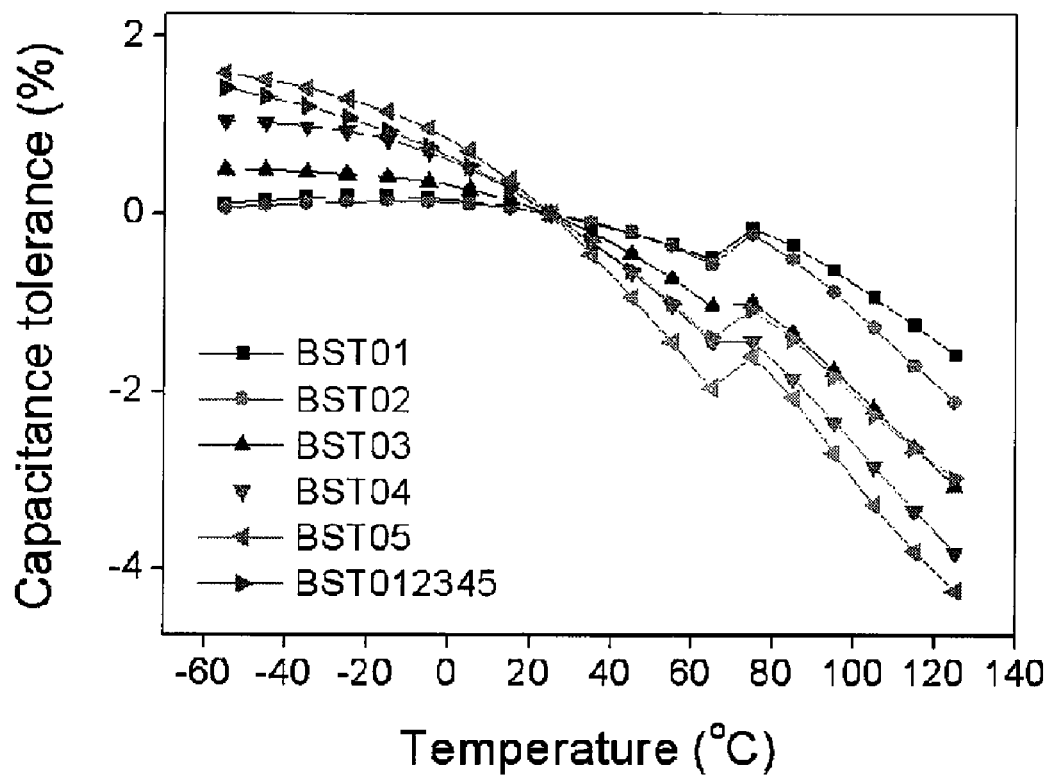
FIG. 10 represents experimental data of BST012345 that is an embodiment of the present invention.
Figure 10:
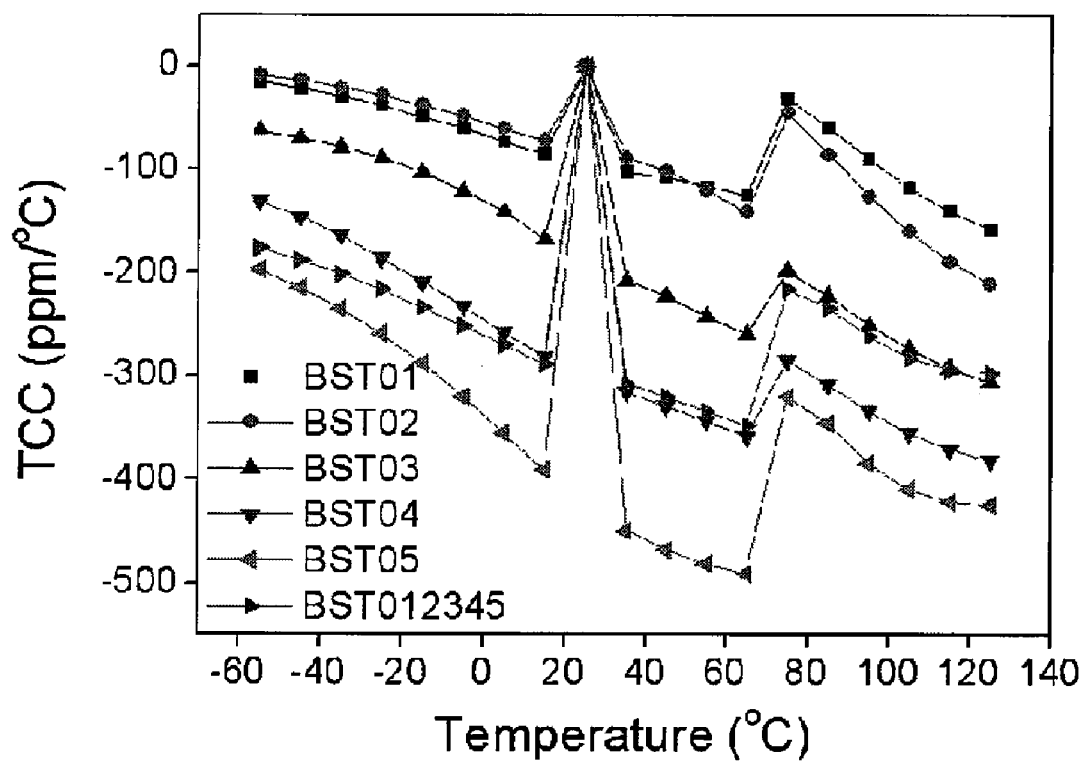

FIG. 10 shows the experimental results of Experiment 3. As shown in FIG. 10, BST012345 has more constant capacitance variation and TCC values according to temperature changes than the individual cases of ceramic fillers.

Experiment 4

Figure 11:
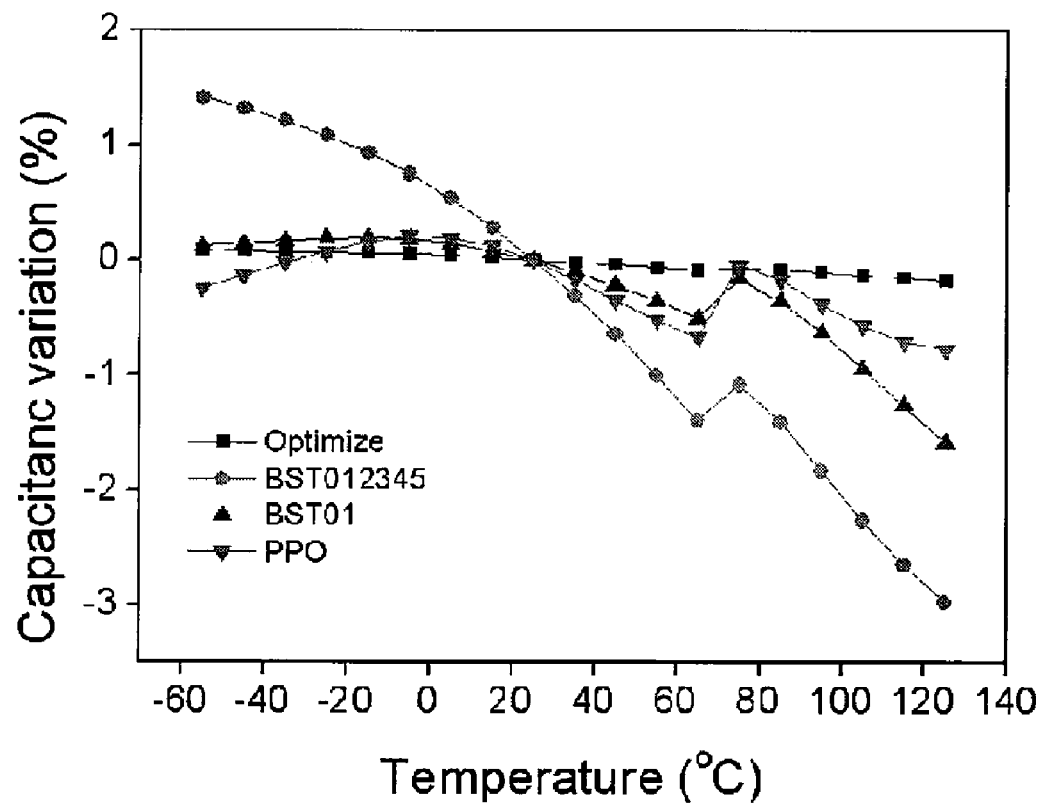
FIG. 11 represents experimental data in relation to content optimization of each BST according to an embodiment of the present invention.
Figure 11:
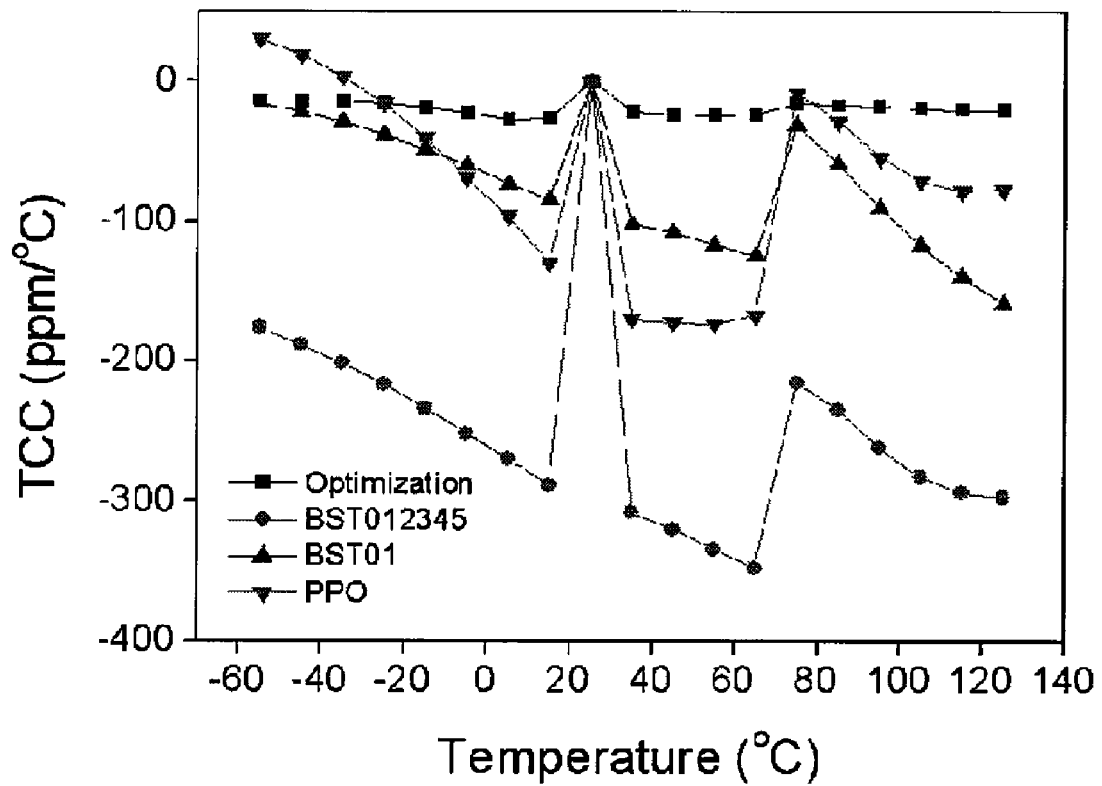

Based on the experimental results of the above Experiment 3, the total amount of ceramic fillers was limited to 30 vol. %, and in order to minimize the change in TCC according to the temperature, the composition of each of different kinds of ceramic fillers was optimized. As a result, when $Ba_{0.9}Sr_{0.2}TiO$, $Ba_{0.8}Sr_{0.1}TiO$, $Ba_{0.7}Sr_{0.3}TiO$, $Ba_{0.6}Sr_{0.4}TiO$ and $Ba_{0.5}Sr_{0.5}TiO$ were added to 70 vol. % of PPO functioning as a polymer matrix with 27 vol. %, 0.6 vol. %, 06 vol. %, 1.2 vol. % and 0.6 vol. %, respectively, the dielectric constant was 7.3, and the dielectric loss was 0.003. Therefore, as shown in FIG. 11, a dielectric body having a TTC value of −30 to −10 ppm/° C. within a temperature range of −55 to 125° C. could be manufactured. Since the dielectric body has a dielectric density of 215 pF/cm², it has an appropriate value for a capacitor-embedded material for signal matching.

As shown in FIG. 11, the indicator "Optimize" represents the optimized combination of ceramic fillers, and it has an excellent stability according to temperature changes.

Comparative Example

A sample in the shape of a disk was manufactured in the same way as the experimental method of the above Experiment 1, except that it was manufactured only using Poly (2,6-dimethyl phenylene oxide, Sigma-Aldrich Corporation) without ceramic fillers.

Figure 12:
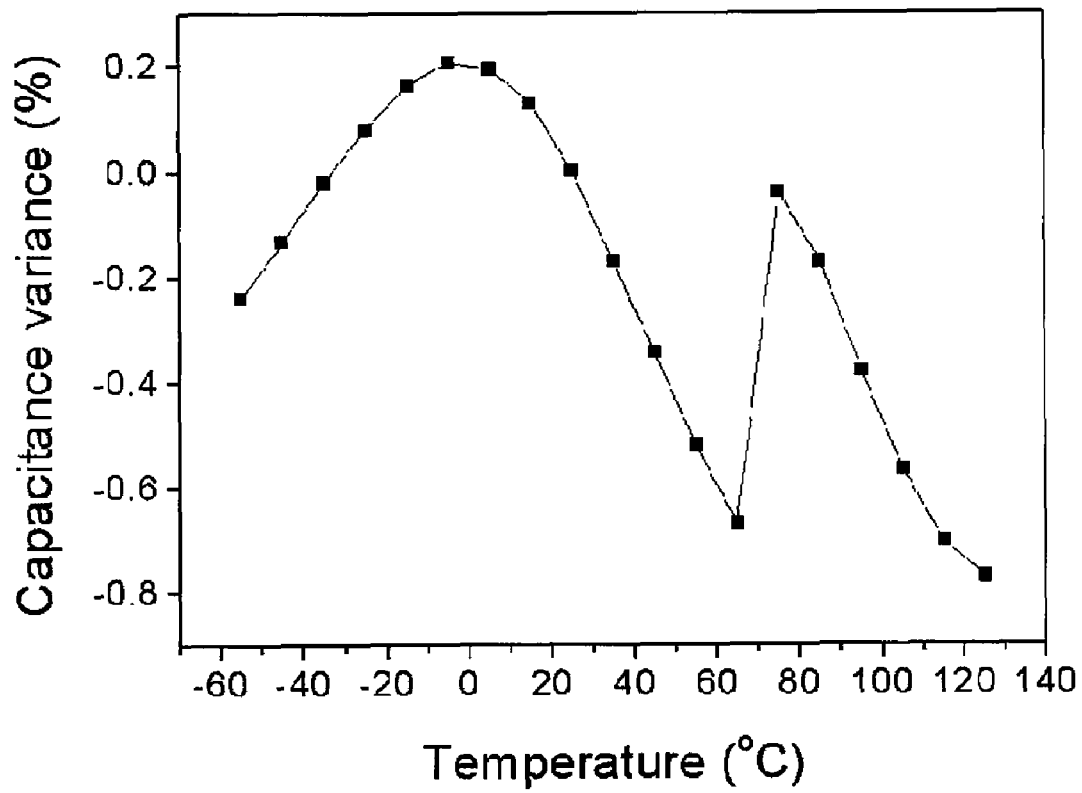
FIG. 12 represents experimental data of PPO that is an experimental example of the present invention.
Figure 12:
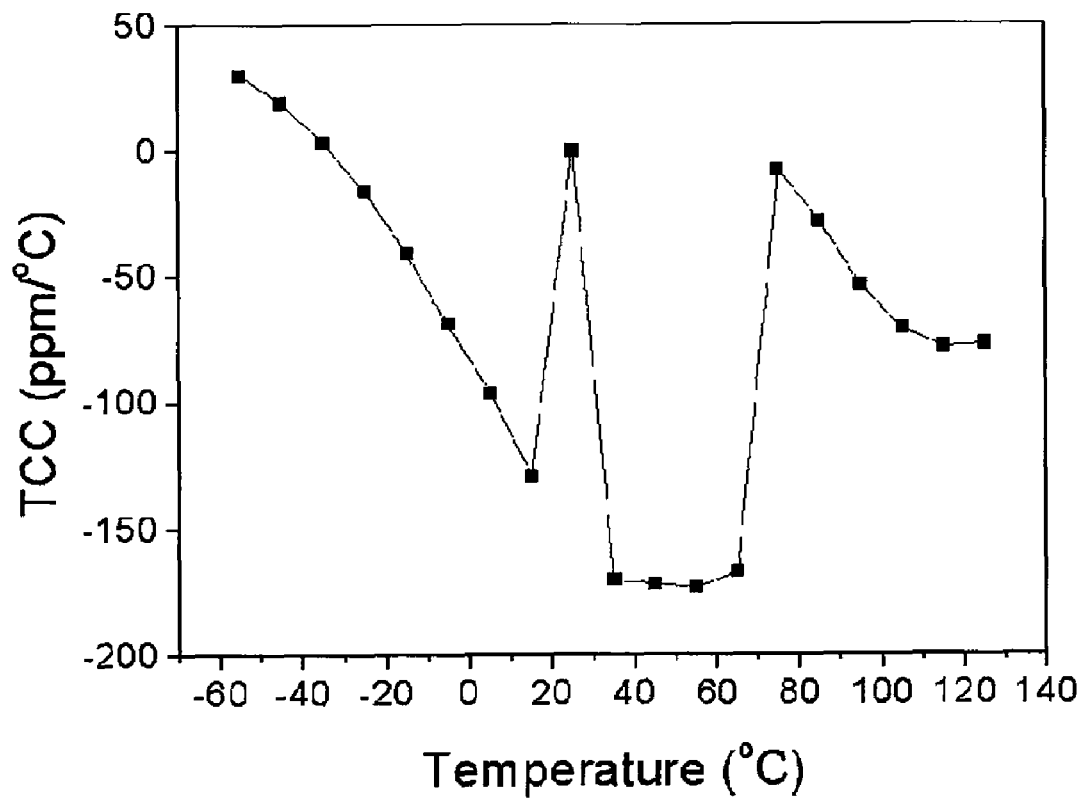

The capacitance variation and TCC values of the sample in the shape of a disk were measured in the same way as the above Experiment 2, and the experimental results are shown in FIG. 12.

The capacitance variation value has the highest value of 0.21% at the temperature of −5 degrees Celsius, but has a large change in value, up to −0.77%, depending on the temperature change. The TCC value also has a large change in value from −173 to 30 ppm/° C., depending on the temperature change.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. A dielectric body using a polymer matrix and being expressed in the following Reaction Scheme 1, comprising two or more kinds of ceramic fillers having different x values in the following Reaction Scheme 1, $$Ba_{1-x}Sr_xTiO_3 \qquad \text{[Reaction Scheme 1]}$$

whereas $0<x\leqq1$.

2. The dielectric body of claim 1, wherein a total amount of the two or more kinds of ceramic fillers having different x values is 10 to 60 vol. % of the volume of the dielectric body.

3. The dielectric body of claim 1, wherein a type of the two of more kinds of ceramic fillers having different x values being used in the dielectric body and an amount of each of the two or more kinds of ceramic fillers being used are controlled such that a certain TCC (constant temperature coefficient of capacitance, ppm/° C.) value or a certain capacitance variation value is maintained in spite of a change in temperature.

4. The dielectric body of claim 3, wherein the dielectric body has a TTC value of −300 to 300 ppm/° C. in a temperature range of −55 to 125° C.

5. The dielectric body of claim 1, wherein the two or more kinds of ceramic fillers having different x values comprise $Ba_{0.9}Sr_{0.1}TiO_3$, $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$.

6. The dielectric body of claim 1, wherein a total amount of the two or more kinds of ceramic fillers having different x values is 20 to 40 vol. % of the volume of the dielectric body.

7. The dielectric body of claim 5, wherein, among the two or more kinds of ceramic fillers having different x values, the $Ba_{0.9}Sr_{0.1}TiO_3$ is 20~30 vol. %, the $Ba_{0.8}Sr_{0.2}TiO_3$ is 0.1~1 vol. %, the $Ba_{0.7}Sr_{0.3}TiO_3$ is 0.1~1 vol. %, the $Ba_{0.6}Sr_{0.4}TiO_3$ is 0.1~2 vol. %, and the $Ba_{0.5}Sr_{0.5}TiO_3$ is 0.1~1 vol. %.

8. A method of manufacturing a dielectric body, the method comprising:
manufacturing a polymer solution by mixing a first solvent and a polymer matrix together, the polymer matrix being soluble in the first solvent;
manufacturing a ceramic filler sol by mixing the first solvent, a dispersing agent and ceramic fillers together;
manufacturing a dispersion by mixing the polymer solution and the ceramic filler sol together;
precipitating the polymer matrix having the ceramic fillers dispersed therein by dropping droplets of the dispersion in a second solvent one at a time, the second solvent being insoluble in the first solvent; and
evaporating the solvent by drying the precipitated polymer matrix,
wherein the order of the manufacturing of the polymer solution and the manufacturing of the ceramic filler sol is interchangeable.

9. The method of claim 8, wherein the ceramic fillers are expressed in the following Reaction Scheme 1 and comprise two or more kinds of ceramic fillers having different x values in the following Reaction Scheme 1, $$Ba_{1-x}Sr_xTiO_3 \qquad \text{[Reaction Scheme 1]}$$

whereas $0<x\leqq1$.

10. The method of claim 8, wherein a total amount of the two or more kinds of ceramic fillers having different x values is 10 to 60 vol. % of the volume of the dielectric body.

11. The method of claim 8, wherein a type of the two or more kinds of ceramic fillers having different x values being used in the dielectric body and an amount of each of the two or more kinds of ceramic fillers being used are controlled such that a certain TCC (constant temperature coefficient of capacitance, ppm/° C.) value is maintained in spite of a change in temperature.

12. The method of claim 8, wherein the two or more kinds of ceramic fillers having different x values comprise $Ba_{0.9}Sr_{0.1}TiO_3$, $Ba_{0.8}Sr_{0.2}TiO_3$, $Ba_{0.7}Sr_{0.3}TiO_3$, $Ba_{0.6}Sr_{0.4}TiO_3$ and $Ba_{0.5}Sr_{0.5}TiO_3$.

13. The method of claim 8, wherein a total amount of the two or more kinds of ceramic fillers having different x values is 20 to 40 vol. % of the volume of the dielectric body.

14. The method of claim 12, wherein, among the two or more kinds of ceramic fillers having different x values, the $Ba_{0.9}Sr_{0.1}TiO_3$ is 20~30 vol. %, the $Ba_{0.8}Sr_{0.2}TiO_3$ is 0.1~1 vol. %, the $Ba_{0.7}Sr_{0.3}TiO_3$ is 0.1~1 vol. %, the $Ba_{0.6}Sr_{0.4}TiO_3$ is 0.1~2 vol. %, and the $Ba_{0.5}Sr_{0.5}TiO_3$ is 0.1~1 vol. %.

15. The method of claim 8, wherein the first solvent is toluene and the second solvent is methanol.

16. An insulating material for a capacitor-embedded substrate using the dielectric body according to claims 1 to 3.

17. A capacitor-embedded substrate using the insulating material according to claim 16.

* * * * *